(12) United States Patent
Aydin et al.

(10) Patent No.: US 12,033,848 B2
(45) Date of Patent: Jul. 9, 2024

(54) PROCESSES FOR DEPOSITING SIB FILMS

(71) Applicant: Applied Materials, Inc., Santa Clara, CA (US)

(72) Inventors: Aykut Aydin, Sunnyvale, CA (US); Rui Cheng, Santa Clara, CA (US); Karthik Janakiraman, San Jose, CA (US); Abhijit B. Mallick, Fremont, CA (US); Takehito Koshizawa, San Jose, CA (US); Bo Qi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 17/352,039

(22) Filed: Jun. 18, 2021

(65) Prior Publication Data

US 2022/0406594 A1 Dec. 22, 2022

(51) Int. Cl.
*H01L 21/02* (2006.01)
(52) U.S. Cl.
CPC .. *H01L 21/02123* (2013.01); *H01L 21/02211* (2013.01); *H01L 21/02271* (2013.01)
(58) Field of Classification Search
CPC ......... H01L 21/02123; H01L 21/02211; H01L 21/02271
See application file for complete search history.

(56) References Cited

U.S. PATENT DOCUMENTS

| 6,255,152 B1 | 7/2001 | Chen |
| 2009/0098741 A1 | 4/2009 | Tanaka et al. |
| 2009/0111246 A1* | 4/2009 | Bauer ............... H01L 21/02535 118/722 |
| 2011/0250757 A1* | 10/2011 | Sukekawa ........... H01L 21/0337 257/E21.249 |
| 2018/0261684 A1 | 9/2018 | Jin |

(Continued)

FOREIGN PATENT DOCUMENTS

WO WO-2008042695 A2 * 4/2008 ........... C23C 16/308

OTHER PUBLICATIONS

Line Edge Roughness (https://semiengineering.com/knowledge_centers/manufacturing/lithography/line-edge-roughness-ler/ accessed online Oct. 20, 2022) (Year: 2022).*

(Continued)

*Primary Examiner* — Michael G Miller
(74) *Attorney, Agent, or Firm* — Patterson + Sheridan, LLP; Mitchel Jones

(57) ABSTRACT

Embodiments of the present disclosure generally relate to processes for forming silicon- and boron-containing films for use in, e.g., spacer-defined patterning applications. In an embodiment, a spacer-defined patterning process is provided. The process includes disposing a substrate in a processing volume of a processing chamber, the substrate having patterned features formed thereon, and flowing a first process gas into the processing volume, the first process gas comprising a silicon-containing species, the silicon-containing species having a higher molecular weight than $SiH_4$. The process further includes flowing a second process gas into the processing volume, the second process gas comprising a boron-containing species, and depositing, under deposition conditions, a conformal film on the patterned features, the conformal film comprising silicon and boron.

20 Claims, 4 Drawing Sheets

(56) References Cited

U.S. PATENT DOCUMENTS

2019/0326110 A1* 10/2019 Gadre .................. H01L 21/0217
2020/0211834 A1    7/2020 Yang et al.

OTHER PUBLICATIONS

International Search Report and Written Opinion dated Oct. 13, 2022 for Application No. PCT/US2022/033744.
Mitsuko Muroi et al., "Boron-Silicon Film Chemical Vapor Deposition Using Boron Trichloride, Dichlorosilane and Monomethysilane Gases", ECS Journal of Solid State Science and Technology, vol. 10, No. 6, Jun. 16, 2021; 6 pages.

* cited by examiner

PROCESSES FOR DEPOSITING SIB FILMS

BACKGROUND

Field

Embodiments of the present disclosure generally relate to processes for forming silicon- and boron-containing films for use in, e.g., spacer-defined patterning applications.

Description of the Related Art

The evolution of chip designs continually requires faster circuitry and greater circuit density. The demands for greater circuit density necessitate a reduction in the dimensions of the integrated circuit components. As the dimensions of the integrated circuit components are reduced (e.g. to submicron dimensions), more elements are required to be put in a given area on a semiconductor integrated circuit. However, conventional lithography-based patterning processes are challenging in the face of such pattern miniaturization. Approaches to miniaturization include spacer patterning such as self-aligned double patterning (SADP) and self-aligned quadruple patterning (SAQP).

In self-aligned double patterning, mandrels are patterned on an underlying layer. A film (or layer(s)) is then deposited on the exposed surfaces of the mandrels and the underlying layer. Horizontal surfaces of the film and the mandrels are then etched to form spacers. Such an approach allows for the formation of narrow gates at half the original pitch. However, SADP and other patterning approaches suffer from high line edge roughness (LER) and high line width roughness (LWR), which describe the amount of variation on the edges and widths of the resist features. Moreover, LER and LWR become more and more significant as feature sizes become smaller, thereby limiting the effective resolution of the semiconductor features. Accordingly, as lithography techniques push components to smaller dimensions, achieving requirements for LER and LWR becomes increasingly challenging.

There is a need for new and improved processes for forming silicon- and boron-containing films having improved properties, e.g., reduced roughness.

SUMMARY

Embodiments of the present disclosure generally relate to processes for forming silicon- and boron-containing films for use in, e.g., spacer-defined patterning applications.

In an embodiment, a spacer-defined patterning process is provided. The process includes disposing a substrate in a processing volume of a processing chamber, the substrate having patterned features formed thereon, and flowing a first process gas into the processing volume, the first process gas comprising a silicon-containing species, the silicon-containing species having a higher molecular weight than $SiH_4$. The process further includes flowing a second process gas into the processing volume, the second process gas comprising a boron-containing species, and depositing, under deposition conditions, a conformal film on the patterned features, the conformal film comprising silicon and boron.

In another embodiment, a process for controlling film roughness is provided. The process includes disposing a substrate in a processing volume of a processing chamber, the substrate having patterned features formed thereon, and flowing a first process gas comprising a silicon-containing species into the processing volume, the silicon-containing species having a higher molecular weight than $SiH_4$. The process further includes flowing a second process gas comprising a boron-containing species into the processing volume, and depositing, under deposition conditions, a film on the patterned features, the film comprising silicon and boron, the film having a line edge roughness of about 1.5 nm or less.

In another embodiment, a patterning process is provided. The process includes disposing a substrate in a processing volume of a thermal chemical vapor deposition chamber, the substrate having patterned features formed thereon. The process further includes flowing a first process gas comprising a silicon-containing species into the processing volume, the silicon-containing species comprising disilane, trisilane, tetrasilane, dichlorosilane, trichlorosilane, tetrachlorosilane, diiodosilane, bis(t-butylamino)silane, tris(dimethylamino)silane, or combinations thereof. The process further includes flowing a second process gas comprising a boron-containing species into the processing volume, the boron-containing species comprising diborane ($B_2H_6$), trimethylborane ($B(CH_3)_3$), triethylborane ($B(C_2H_5)_3$), boron trifluoride ($BF_3$), or combinations thereof. The process further includes depositing an SiB film on the patterned features, and etching a portion of the SiB film, the patterned features, or a combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
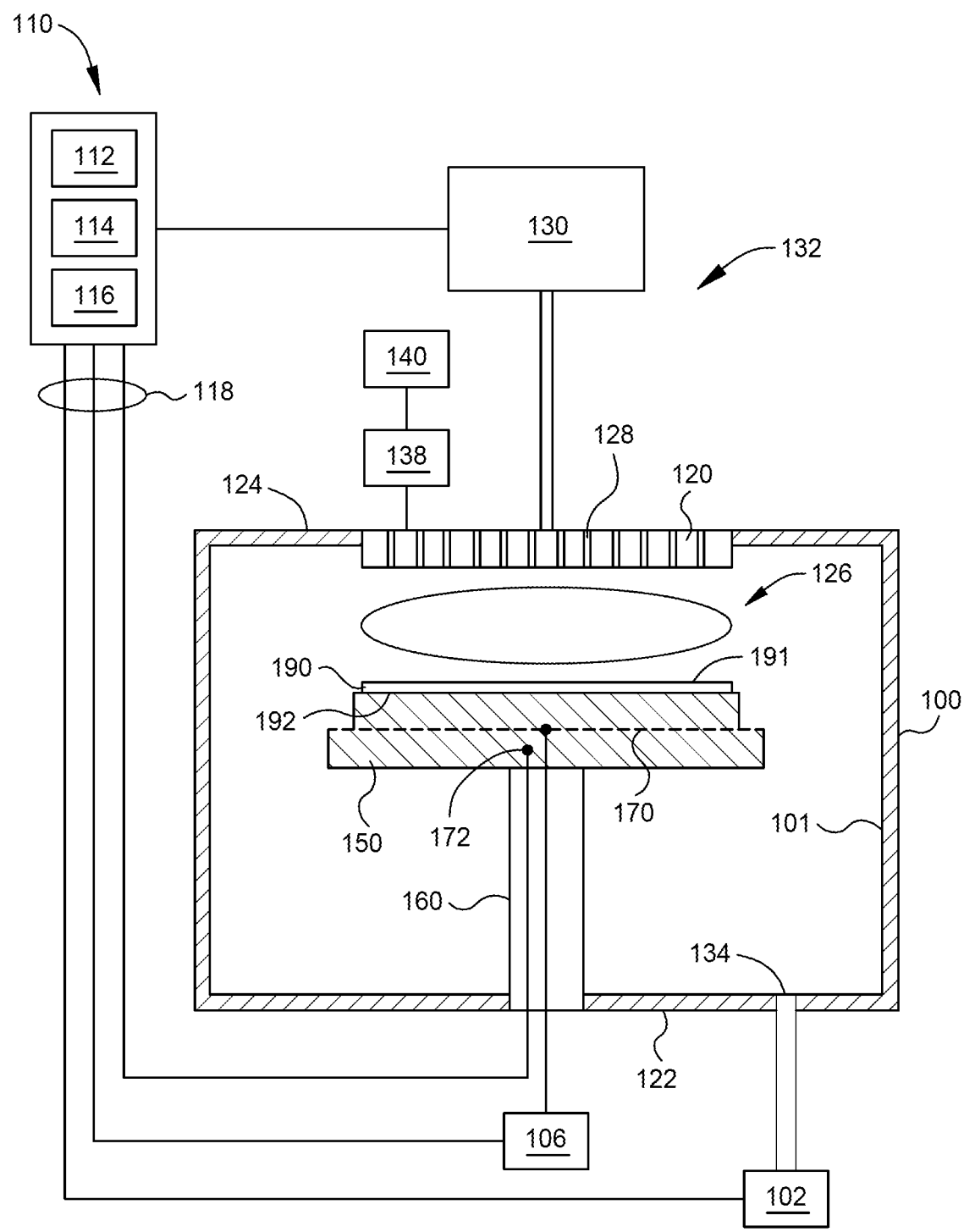
FIG. 1 is an example chamber for performing operations described herein according to at least one embodiment.

Embodiments of the present disclosure generally relate to processes for forming silicon- and boron-containing films for use in, e.g., spacer-defined patterning applications among many other applications. The inventors have found new and improved processes for forming SiB-containing films having improved properties such as line edge roughness (LER), line width roughness (LWR), and etch selectivity. Briefly, and in some embodiments, a SiB-containing film is deposited using chemical vapor deposition by flowing a first process gas that includes a silicon-containing species into a processing chamber and flowing a second process gas that includes a boron-containing species into a processing chamber. The silicon-containing species has a molecular weight that is higher than silane ($SiH_4$). The SiB-containing film has, e.g., improved LER, improved LWR, and/or improved etch selectivity over conventional films used in, e.g., spacer-defined patterning.

The process for forming SiB-containing films can be applied to a wide number of SiB products and applications such as spacer-defined patterning. Other products and applications include high-temperature products such as those formed by thermal chemical vapor deposition or plasma-enhanced chemical vapor deposition used for, e.g., hard mask applications in dynamic random access memory (DRAM) capacitor etch. Products and applications also include low-temperature products and multicolor applications in patterning.

The inventors found that the pattern roughness for the deposited silicon-boron (SiB) films (or layer(s)) can be improved by utilizing higher molecular weight silicon-containing species in deposition processes, such as chemical vapor deposition (CVD) processes, such as thermal chemical vapor deposition (TCVD) processes. In some embodiments, a large improvement in line edge roughness and line width roughness is observed when using disilane (or other higher molecular weight silicon-containing species) over silane ($SiH_4$) across a broad range of process conditions and final boron concentrations of the deposited amorphous SiB film.

The SiB films formed by processes described herein have etch-selectivity benefits over conventional SiN films (such as SiN films made by atomic layer deposition), or other etchable films involved in patterning schemes. For example, as compared to SiN films, the SiB films formed by processes described herein can have a more uniform post-etch spacer profile with a square top profile. Such etch selectivity benefits can simplify etch development and pattern integration schemes. Moreover, the process enables formation of an SiB film (or layer(s)) having improved surface roughness (e.g., LER and/or LWR) relative to conventional methods.

Utilizing a silicon-containing species having a higher molecular weight than silane ($SiH_4$) improves the LER and LWR. While not wishing to be bound by theory, it is believed that the roughening mechanism for SiB deposition is nucleation. Switching to higher molecular weight species improves nucleation across a range of process conditions and boron concentrations. One explanation for this improvement can be that larger molecular weight species sticks to the substrate better and generates nuclei above the critical nuclei size more readily. Additionally, during the ensuing growth of the SiB film, larger molecular weight species may suppress roughness coming from surface diffusion.

FIG. 1 is an example of a substrate processing system 132 for performing one or more operations of a process to form a SiB film. Examples of suitable systems include the CENTURA® systems, PRECISION 5000® systems, and PRODUCER® systems commercially available from Applied Materials, Inc., Santa Clara, Calif. It is contemplated that other processing systems, including those available from other manufacturers, may be adapted to practice the implementations described herein.

The substrate processing system 132 includes a processing chamber 100 coupled to a gas panel 130 and a controller 110. The processing chamber 100 includes a top wall 124, a sidewall 101, and a bottom wall 122 that define a processing volume 126. A substrate support 150 is disposed in the processing volume 126 of the processing chamber 100. The substrate support 150 is supported by a stem 160 and can be moved in a vertical direction inside the processing chamber 100 using a displacement mechanism (not shown). The substrate support 150 includes a heating element 170 to control the temperature of a substrate 190 supported on a surface 192 of the substrate support 150. The substrate support 150 is resistively heated by applying an electric current from a power supply 106 to the heating element 170. The electric current supplied from the power supply 106 is regulated by the controller 110 to control the heat generated by the heating element 170, to maintain the substrate 190 and the substrate support 150 at a substantially constant temperature during film deposition. The supplied electric current can be adjusted to selectively control the temperature of the substrate support 150 from about 100° C. to about 700° C.

A temperature sensor 172 embedded in the substrate support 150 is utilized to monitor the temperature of the substrate support 150. The measured temperature is used by the controller 110 to control the power supplied to the heating element 170 and maintain the substrate at a desired temperature. A vacuum pump 102 is coupled to a port 134 formed in the bottom wall 122 of the processing chamber 100. The vacuum pump 102 maintains a desired gas pressure in the processing chamber 100 and evacuates post-processing gases and by-products of the process from the processing chamber 100.

A showerhead 120 having a plurality of apertures 128 is disposed on the top of the processing chamber 100 above the substrate support 150. The apertures 128 of the showerhead 120 are utilized to introduce process gas(es) into the processing chamber 100. The showerhead 120 is connected to the gas panel 130 to allow various gases to supply the processing volume 126. A plasma is formed from the process gas(es) exiting the showerhead 120 to enhance thermal decomposition of the process gases resulting in the deposition of material on a surface 191 of the substrate 190.

The showerhead 120 and substrate support 150 can form a pair of spaced apart electrodes in the processing volume 126. One or more radio frequency (RF) power sources 140 provide a bias potential through a matching network 138 to the showerhead 120 to facilitate generation of plasma between the showerhead 120 and the substrate support 150. Alternatively, the RF power sources 140 and matching network 138 can be coupled to the showerhead 120, substrate support 150, or coupled to both the showerhead 120 and the substrate support 150, or coupled to an antenna (not shown) disposed exterior to the processing chamber 100. The one or more RF power sources can provide a power of about 100 W to about 3,000 W, such as from about 500 W to about 1,800 W, at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 can be of any suitable form of a general-purpose computer processor. The software routines can be stored in the memory 116, such as random access memory, read only memory, floppy, or hard disk drive, or other form of digital storage. The support circuit 114 is coupled to the CPU 112 and can include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

Figure 2:
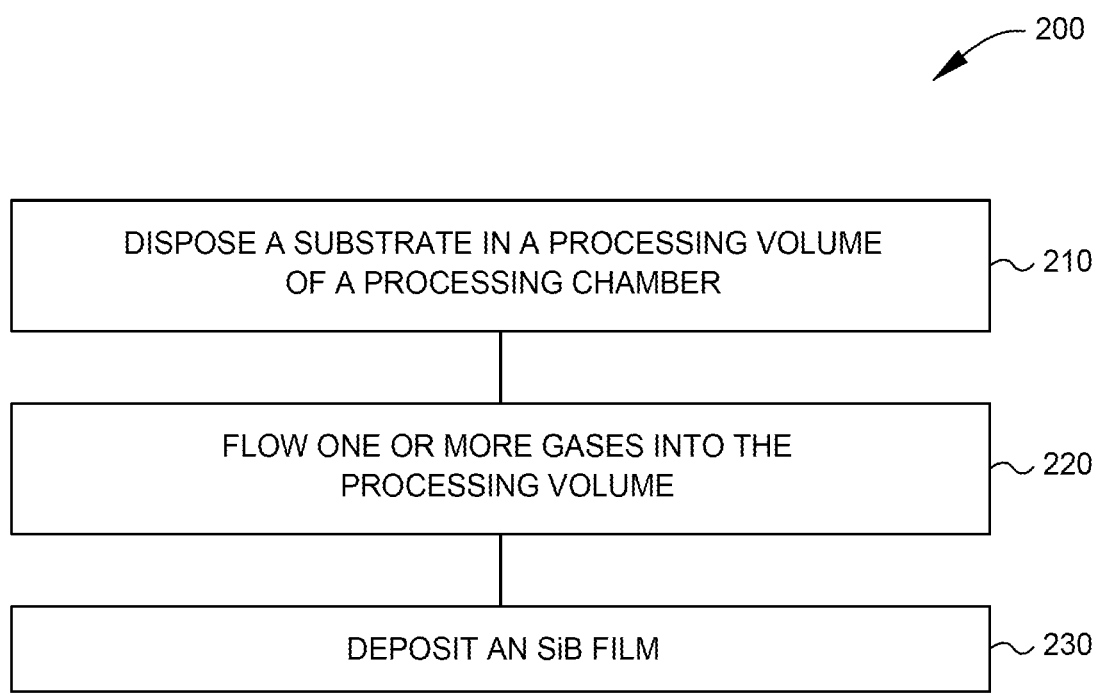
FIG. 2 is a flowchart showing selected operations of an example process for forming SiB films according to at least one embodiment of the present disclosure.

FIG. 2 is a flowchart showing selected operations of an example deposition process for forming a SiB film according to at least one embodiment of the present disclosure. The SiB film can be a monolayer film or multilayer film. The SiB film can be amorphous. The SiB films described herein have etch-selectivity benefits over conventional SiN films (such as SiN films made by atomic layer deposition), or other etchable films involved in patterning schemes. For example, as compared to SiN films, the SiB films formed by processes described herein can have a more uniform post-etch spacer profile with a square top profile. Moreover, the process enables formation of an SiB film (or layer(s)) having improved surface roughness (e.g., LER and/or LWR) relative to conventional methods.

Process 200 includes disposing a substrate in a processing volume of a substrate processing chamber at operation 210. As an example, the substrate, e.g., substrate 190, is transferred into the processing chamber 100 and onto the substrate support 150 by any suitable means, such as by substrate transfer port. The substrate support 150 can be adjusted to a processing position by an using a displacement mechanism. The substrate 190 can be substantially planar. Alternatively, the substrate 190 can have patterned structures, a surface having trenches, holes, or vias formed therein. The substrate 190 may also have a substantially planar surface having a structure formed thereon or therein at a desired elevation. While the substrate 190 shown in FIG. 1 is illustrated as a single body, it is understood that the substrate 190 can contain one or more materials used in forming semiconductor devices such as metal contacts, trench isolations, gates, bitlines, or any other interconnect features. The substrate 190 can include one or more metal materials, one or more dielectric materials, semiconductor material, and combinations thereof utilized to fabricate semiconductor devices. For example, the substrate 190 can include an oxide material, a nitride material, a polysilicon material, or the like, depending upon application.

In embodiments where a memory application is desired, the substrate 190 may include the silicon substrate material, an oxide material, and a nitride material, with or without polysilicon sandwiched in between. In other embodiments, the substrate 190 can include a plurality of alternating oxide and nitride materials (e.g., oxide-nitride-oxide (ONO)) deposited on a surface of the substrate (not shown). In various embodiments, the substrate 190 can include a plurality of alternating oxide and nitride materials, one or more oxide or nitride materials, polysilicon or amorphous silicon materials, oxides alternating with amorphous carbon, oxides alternating with polysilicon, undoped silicon alternating with doped silicon, undoped polysilicon alternating with doped polysilicon, or undoped amorphous silicon alternating with doped amorphous silicon. The substrate 190 can be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

Process 200 further includes flowing one or more gases into the processing volume within the chamber (e.g., a CVD chamber, such as a thermal CVD chamber) at operation 220. For example, and as shown in FIG. 1, various gases (e.g., silicon-containing gas(es), boron-containing gas(es), and/or non-reactive gas(es)) are flown from the gas panel 130 to the showerhead 120 and then to the processing volume 126. In some embodiments, a first process gas comprising a silicon-containing species (which may be in the form of a gas(es) or formed into gas(es)) is flown into the processing volume through an inlet, and a second process gas comprising a boron-containing species (which may be in the form of a gas(es) or formed into gas(es)) is flown through the same or different inlet. The first process gas can include more than one silicon-containing species and the second process gas can include more than one boron-containing species. The first process gas and/or the second process gas can include a non-reactive gas such as helium (He), argon (Ar), and/or $N_2$. Additionally, or alternatively, the non-reactive gas can be flown through a different inlet than the first and second process gas.

In some embodiments, the first process gas and the second process gas are co-flown into the processing volume. For example, the first process gas comprising one or more silicon-containing species and a second process gas comprising one or more boron-containing species are co-flown into the processing volume. Additionally, or alternatively, the second process gas is intermittently flown into the processing volume while the first process gas is flown into the processing volume, or vice-versa. The non-reactive gas(es) can be co-flown with the first process gas, second process gas, or both. Additionally, or alternatively, the non-reactive gas can be flown intermittently into the processing volume while the first process gas and/or the second process gas is flown into the processing volume, or vice-versa.

Additionally, or alternatively, the first process gas comprising one or more silicon-containing species and the second process gas comprising one or more boron-containing species can be sequentially flown into the processing volume. For example, the first process gas is flown into the processing volume, then the second process gas is flown into the processing volume, and then the first process gas is again flown into the processing volume. As another example, the second process gas is flown into the processing volume, then the first process gas is flown into the processing volume, and then the second process gas is again flown into the processing volume. As another example, the first process gas and the second process gas are co-flown into the processing volume, then the flow of the first or second process gas is stopped, while the second process gas or first process gas, respectively, is still flown into the processing volume. At a certain time period, flow of the first or second process gas is resumed. One or more ampoules, one or more bubblers, and/or one or more liquid vaporizers may be used to provide the first process gas, the second process gas, or a combination thereof to the processing chamber.

Silicon-containing species or precursors that are useful for embodiments described herein include silane ($SiH_4$), higher order silanes (e.g., halogenated silanes, organosilanes, and/or substituted organosilanes), and/or mixtures and combinations thereof. Higher order silanes refer to silicon-containing species that have a higher molecular weight than $SiH_4$ (a higher molecular weight than about 32 g/mol) which includes compounds having the formula:

$$Si_nH_{2n+2},$$

where n is 2 or more, such as from 2 to 10, such as from 2 to 6. Illustrative, but non-limiting, examples include disilane ($Si_2H_6$), trisilane ($Si_3H_8$), tetrasilane ($Si_4H_{10}$), pentasilane ($Si_5H_{12}$), hexasilane ($Si_6H_{14}$), and so forth.

Other silicon-containing species or precursors that are useful for embodiments described herein include compounds having the formula:

$$Si_xX'_yH_{(2x+2-y)},$$

where:

x is 1 or more, such as from 1 to 10, such as from 1 to 6, such as from 2 to 5, y is 1 or more, such as from 1 to 22, such as from 2 to 20, such as from 2 to 14, such as from 2 to 10, and each X' is, independently, a halogen (F, Cl, Br or I, or combinations thereof), $C_1$-$C_{20}$ hydrocarbyl (such as $C_1$-$C_{10}$ hydrocarbyl, such as $C_1$-$C_6$ hydrocarbyl, such as $C_1$-$C_4$ hydrocarbyl), $C_1$-$C_{20}$ substituted hydrocarbyl (such as $C_1$-$C_{10}$ substituted hydrocarbyl, such as $C_1$-$C_6$ substituted hydrocarbyl, such as $C_1$-$C_4$ such as hydrocarbyl), $C_1$-$C_{22}$ aryl (such as $C_3$-$C_{10}$ aryl, such as $C_6$-$C_{10}$ aryl or $C_5$-$C_6$ aryl), $C_1$-$C_{22}$ substituted aryl (such as $C_3$-$C_{10}$ substituted aryl, such as $C_6$-$C_{10}$ substituted aryl or $C_5$-$C_6$ substituted aryl), —NR'$_2$, —SR', —OR', —OSiR'$_3$, or —PR'$_2$, wherein each R' is independently hydrogen, halogen, $C_1$-$C_{20}$ hydrocarbyl or $C_1$-$C_{20}$ substituted hydrocarbyl, or $C_1$-$C_{22}$ aryl or $C_1$-$C_{22}$ substituted aryl.

Illustrative, but non-limiting, examples of compounds having the formula $Si_xX'_yH_{(2x+2-y)}$ include halogenated silanes such as halogenated silanes, organosilanes, and/or substituted organosilanes. Non-limiting examples of halogenated silanes include chlorosilane ($SiH_3Cl$), dichlorosilane ($SiH_2Cl_2$), trichlorosilane ($SiHCl_3$), tetrachlorosilane ($SiCl_4$), hexachlorodisilane ($Si_2Cl_6$), iodosilane ($SiH_3I$), diiodosilane ($SiH_2I_2$), triiodosilane ($SiHI_3$), silicon tetraiodide ($SiI_4$), hexaiodosilane ($Si_2I_6$), bromosilane ($SiH_3Br$), dibromosilane ($SiH_2Br_2$), tribromosilane ($SiHBr_3$), silicon tetrabromide ($SiBr_4$). Non-limiting examples or organosilanes include compounds where one or more of X' is, independently, a hydrocarbyl ((e.g., methyl, ethyl, propyl, butyl)), substituted hydrocarbyl, aryl, or substituted aryl, such as methylsilane (($CH_3$)$SiH_3$), dimethylsilane (($CH_3$)$_2$$SiH_2$), ethylsilane (($CH_3CH_2$)$SiH_3$), methyldisilane (($CH_3$)$Si_2H_5$), dimethyldisilane (($CH_3$)$_2$$Si_2H_4$) and hexamethyldisilane (($CH_3$)$_6$$Si_2$).

Substituted organosilanes include aminosilanes and halogenated aminosilanes. Examples of such compounds include, but are not limited to bis(t-butylamino)silane ($C_8H_{22}N_2Si$), tris(dimethylamino)silane ($C_6H_{18}N_3Si$), N-[Bis(dimethylamino)silyl]-N-methylmethanamine ($C_6H_{19}N_3Si$), N,N,N',N'-Tetramethylsilanediamine ($C_4H_{12}N_2Si$), N-[bromo-bis(dimethylamino)silyl]-N-methylmethanamine ($C_6H_{18}BrN_3Si$), N-[Bis(dimethylamino)-iodosilyl]-N-methylmethanamine ($C_6H_{18}IN_3Si$), and amino (iodo)silanes such as $SiH_2I(N(iPr)_2)$ and $SiH_2I(N(iBu)_2)$.

Boron-containing species that are useful for embodiments described herein include, but are not limited to, diborane ($B_2H_6$), trimethylborane ($B(CH_3)_3$), triethylborane ($B(C_2H_5)_3$), boron trifluoride ($BF_3$), and/or mixtures and combinations thereof. Other boron-containing species include at least one boron compound having the formula:

$$BR^1R^2R^3,$$

where:

$R^1$ represents a hydrogen, or a linear or branched hydrocarbyl having 1 to 5 carbon atoms, or a linear or branched alkoxy having 1 to 5 carbon atoms, or else an aryl, or an alkylamide, or a linear or branched hydroxyl having 1 to 5 carbon atoms; and $R^2$ and $R^3$ each, independently, represent a linear or branched hydrocarbyl having 1 to 5 carbon atoms, or a linear or branched alkoxy having 1 to 5 carbon atoms, or else an aryl, or an alkylamide, or a linear or branched hydroxyl having 1 to 5 carbon atoms or else $R^2$ and $R^3$ together form, with the boron atom to which they are attached, a saturated heterocycle having 6 ring members comprising 3 boron atoms and three nitrogen atoms arranged alternately in the ring, said heterocycle optionally being substituted by one to five substituents chosen from an hydrocarbyl having 1 to 5 carbon atoms, an aryl, an alkylamide and an alkoxy having 1 to 5 carbon atoms.

The process 200 further includes depositing, under deposition conditions, a film (or layer(s)) on the patterned features, the film (or layer(s)) comprising silicon and boron at operation 230. The deposited layer(s) can be amorphous.

The inventors found that the silicon-containing species (e.g., disilane or higher order silanes) can play an important role during nucleation or the initial part of the deposition. In addition to replacing $SiH_4$ entirely, the inventors found excellent roughness performance by utilizing a pretreatment operation of depositing a silicon-containing precursor on the semiconductor structure (or features thereon, e.g., patterned features) prior to deposition with the silicon- and boron-containing species. Accordingly, and in some embodiments, process 200 further includes a pre-treatment (or nucleation) operation by depositing, under pre-treatment conditions, a Si material on the patterned features. The flow rate of the silicon-containing species can be the same as, or higher than, the flow rate of the silicon-containing species in the deposition operation 230.

The inventors also observed that roughness performance can be improved by flowing a boron-containing species at a higher flow rate than the flow rate utilized during the deposition process of operation 230. Accordingly, and in some embodiments, the pre-treatment operation can include flowing a boron-containing species at a flow rate of about 100 sccm to about 300 sccm, such as from about 150 sccm to about 250 sccm, such as from about 175 sccm to about 225 sccm.

In some embodiments, the spacing between the substrate 190 and the showerhead 120 (or faceplate of the showerhead) can be varied for one or more operations of the processes described herein, such as the deposition of the SiB film/layer(s). The spacing can be adjusted by moving the substrate support 150 up and down using a displacement mechanism. In some embodiments, the spacing between the faceplate and the substrate can be about 300 mils or less, such as from about 100 mils to about 300 mils, such as from about 140 mils to about 300 mils, 150 mils to about 275 mils, such as from about 175 mils to about 250 mils, such as from about 200 mils to about 225 mils. In at least one embodiment, the spacing between the faceplate and the substrate ranges from spacing$_1$ to spacing$_2$ (in units of mils) where each of spacing$_1$ and spacing$_2$ is independently about 100, about 110, about 120, about 130, about 140, about 150, about 160, about 170, about 180, about 190, about 200, about 210, about 220, about 230, about 240, about 250, about 260, about 270, about 280, about 290, or about 300, so long as spacing$_1$<spacing$_2$.

Various operations of the example process described herein (e.g., process 200) include one or more process parameters as described below. For example, operation 220, operation 230, or both, can include one or more of the process parameters.

The substrate can have a temperature of about 400° C. or less, such as from about 100° C. to about 350° C., such as from about 150° C. to about 350° C., such as from about 150° C. to about 250° C., such as from about 200° C. to about 250° C. In at least one embodiment, the temperature of the substrate ranges from $T_1$ to $T_2$ (in units of ° C.), where each of $T_1$ and $T_2$ is independently about 150, about 160, about 170, about 180, about 190, about 200, about 210, about 220, about 230, about 240, about 250, about 260, about 270, about 280, about 290, about 300, about 310, about 320, about 330, about 340, or about 350, as long as $T_1 < T_2$.

A pressure within the processing volume can be about 200 Torr or less, such as about 150 Torr or less, such as about 130 Torr or less, such as about 100 Torr or less, such as about 50 Torr or less, such as about 20 Torr or less, such as about 10 Torr or less. In at least one embodiment, the pressure within the processing volume ranges from $P_1$ to $P_2$ (in units of Torr), where each of $P_1$ and $P_2$ is independently about 1, about 5, about 10, about 20, about 30, about 40, about 50, about 60, about 70, about 80, about 90, about 100, about 110, about 120, about 130, about 140, or about 150, as long as $P_1 < P_2$. In some examples, the pressure within the processing volume can be from about 1 Torr to about 150 Torr, such as from about 10 Torr to about 130 Torr.

In some embodiments, a pressure ramp operation can be utilized. Here, for example, the flows of silicon-containing species, with or without the non-reactive gas, into the processing chamber is from about 500 sccm to about 1,000 sccm, but no boron-containing species is flowing. In this non-limiting example, once the pressure is initially stabilized, the boron-containing species is flown into the process chamber to catalyze the reaction for deposition of SiB.

A flow rate of one or more boron-containing species into the processing volume can be about 100 standard cubic centimeters per minute (sccm) or less, such as from about 5 sccm to about 1000 sccm for a 300 mm-sized substrate, such as from about 10 sccm to about 800 sccm, such as from about 50 sccm to about 500 sccm. In at least one embodiment, the flow rate of the one or more boron-containing species for a 300 mm-sized substrate ranges from flow rate$_1$ to flow rate$_2$ (in units of sccm), where each of flow rate$_1$ and flow rate$_2$ is independently about 5, about 10, about 15, about 20, about 25, about 30, about 35, about 40, about 45, about 50, about 55, about 60, about 65, about 70, about 75, about 80, about 85, about 90, about 95, about 100, about 150, about 200, about 250, about 300, about 350, about 400, about 450, about 500, about 550, about 600, about 650, about 700, about 750, about 800, about 850, about 900, about 950, or about 1,000, as long as flow rate$_1$<flow rate$_2$. In some embodiments, the flow rate of the one or more boron-containing species is from about 5 sccm to about 80 sccm for a 300 mm-sized substrate, such as from about 10 sccm to about 60 sccm, such as from about 20 sccm to about 50 sccm, such as from about 30 sccm to about 40 sccm.

A flow rate of the one or more silicon-containing species into the processing volume can be about 1,000 sccm or less, such as from about 50 sccm to about 1,000 sccm, such as from about 100 sccm to about 500 sccm, such as from about 150 sccm to about 450 sccm, such as from about 200 sccm to about 400 sccm, such as from about 250 sccm to about 350 sccm for a 300 mm-sized substrate. In at least one embodiment, the flow rate of the one or more silicon-containing species for a 300 mm-sized substrate ranges from flow rate$_1$ to flow rate$_2$ (in units of sccm), where each of flow rate$_3$ and flow rate$_4$ is independently about 50, about 100, about 110, about 120, about 130, about 140, about 150, about 160, about 170, about 180, about 190, about 200, about 210, about 220, about 230, about 240, about 250, about 260, about 270, about 280, about 290, about 300, about 310, about 320, about 330, about 340, about 350, about 360, about 370, about 380, about 390, about 400, about 410, about 420, about 430, about 440, about 450, about 460, about 470, about 480, about 490, about 500, about 550, 510, about 520, about 530, about 540, or about 500, as long as flow rate$_3$<flow rate$_4$.

In embodiments where one or more non-reactive gases is utilized, a flow rate of the one or more non-reactive gases into the processing volume can be about 2,000 sccm or less for a 300 mm-sized substrate, such as from about 100 sccm to about 1,700 sccm, such as from about 200 sccm to about 1,500 sccm, such as from about 400 to about 1,200 sccm, such as from about 600 sccm to about 1,000 sccm, such as from about 700 sccm to about 900 sccm. In at least one embodiment, the flow rate of the one or more non-reactive gases for a 300 mm-sized substrate ranges from flow rate$_5$ to flow rate$_6$ (in units of sccm), where each of flow rate$_5$ and flow rate$_6$ is independently about 100, about 150, about 200, about 250, about 300, about 350, about 400, about 450, about 500, about 550, about 600, about 650, about 700, about 750, about 800, about 850, about 900, about 950, about 1,000, about 1,050, about 1,200, about 1,250, about 1,300, about 1,350, about 1,400, about 1,450, about 1,500, about 1,550, about 1,600, about 1,650, about 1,700, about 1,750, about 1,800, about 1,850, about 1,900, about 1,950, or about 2,000, as long as flow rate$_5$<flow rate$_6$.

A flow rate ratio of the one or more boron-containing species to the one or more silicon-containing species can be from about 0.025 to about 0.3, such as from 0.05 to about 0.2, such as from about 0.1 to about 0.15 for a 300 mm-sized substrate. In some embodiments, the flow rate ratio of the one or more boron-containing species to the one or more silicon-containing species is from about 0.025 to about 1.8, such as from about 0.05 to about 1.5, such as from about 0.1 to about 1, such as from about 0.1 to about 0.4.

In embodiments where one or more non-reactive gases are utilized, a flow rate ratio of the one or more silicon-containing species to the one or more non-reactive gases can be from about 0.05 to about 1, such as from 0.2 to about 0.8, such as from about 0.3 to about 0.7, such as from about 0.4 to about 0.6 for a 300 mm-sized substrate. In at least one embodiment, the flow rate ratio of the one or more silicon-containing species to the one or more non-reactive gases for a 300 mm-sized substrate is from about 0.2 to about 0.4, from about 0.3 to about 0.5, from about 0.5 to about 0.6, from about 0.6 to about 0.7, or from about 0.7 to about 0.8.

A deposition time of the SiB film/layer(s) can be about 1 second (s) or more, such as from about 1 s to about 3000 s, such as from about 2 s to about 2000 s, such as from about 30 s to about 3000 s or from about 1000 s to about 1500 s. In at least one embodiment, the deposition time ranges from time$_1$ to time$_2$ (in units of s) where each of time$_1$ and time$_2$ is independently about 1, about 10, about 30, about 60, about 90, about 120, about 150, about 200, about 240, about 300, about 360, about 420, about 480, about 540, about 600, 660, about 720, about 780, about 840, about 900, about 960, about 1000, about 1020, about 1080, about 1140, about 1200, about 1260, about 1320, about 1380, about 1440, about 1500, about 1560, about 1620, about 1680, about 1740, about 1800, about 1860, about 1920, about 1980, or about 2000, so long as time$_1$<time$_2$.

In some embodiments, the deposited SiB film/layer(s) has a boron concentration of about 1 wt % or more or about 50 wt % or less, such as from about 5 wt % to about 45 wt %, such as from about 15 wt % to about 30 wt %, such as from about 20 wt % to about 25 wt % as determined by X-ray photoelectron spectroscopy (XPS). In at least one embodiment, the boron concentration of the SiB film/layer(s) ranges from content$_1$ to content$_2$ (in units of %) where each of content$_1$ and content$_2$ is independently about 1, about 5, about 10, about 15, about 20, about 25, about 30, about 35, about 40, about 45, or about 50, so long as content$_1$<content$_2$.

Example Patterning Scheme

Figure 3:
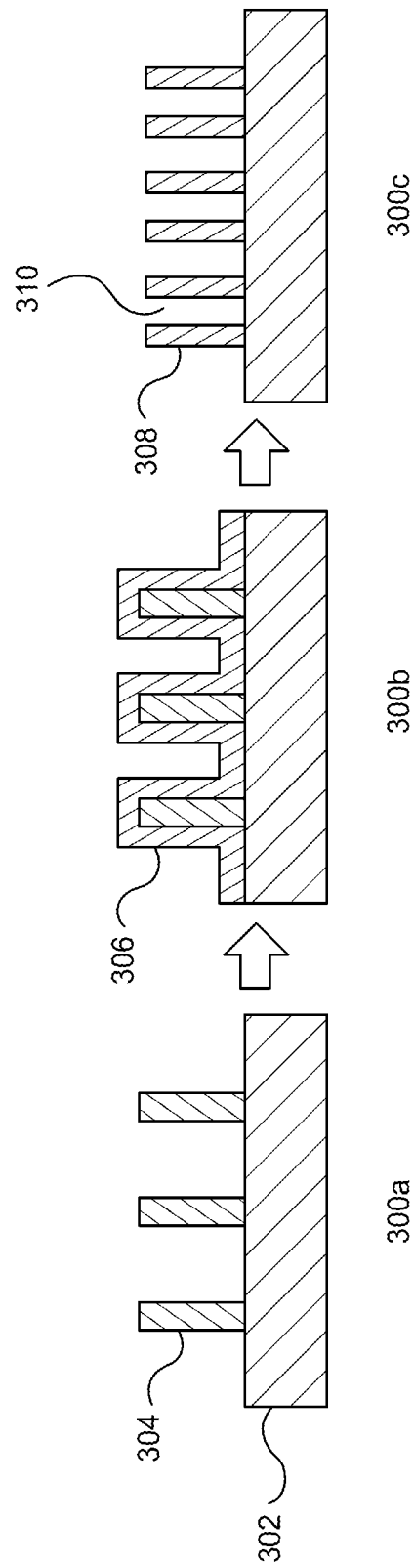
FIG. 3 is a schematic representation of an example patterning sequence according to at least one embodiment of the present disclosure.

Embodiments of the present disclosure also relate to SiB films used in patterning applications. FIG. 3 is a schematic representation of a non-limiting, example patterning sequence according to at least one embodiment of the present disclosure. The representation in FIG. 3 illustrates a double patterning operation (e.g., SADP) to form spacers. At structure 300a, mandrels 304 are patterned on a substrate 302 (or underlying layer). Next, SiB film 306 (or layer(s)) are deposited to cover exposed surfaces of the mandrels 304 and/or substrate 302 (or underlying layer), providing structure 300b. Next, horizontal portions of the SiB film 306 and the mandrels 304 are removed (by, e.g., etching) to form spacers 308, with vacant space 310 between spacers 308, as shown by structure 300c. Other patterning operations such as quadruple patterning (e.g., SAQP) as well as multicolor applications without patterning can be performed.

Figure 4:
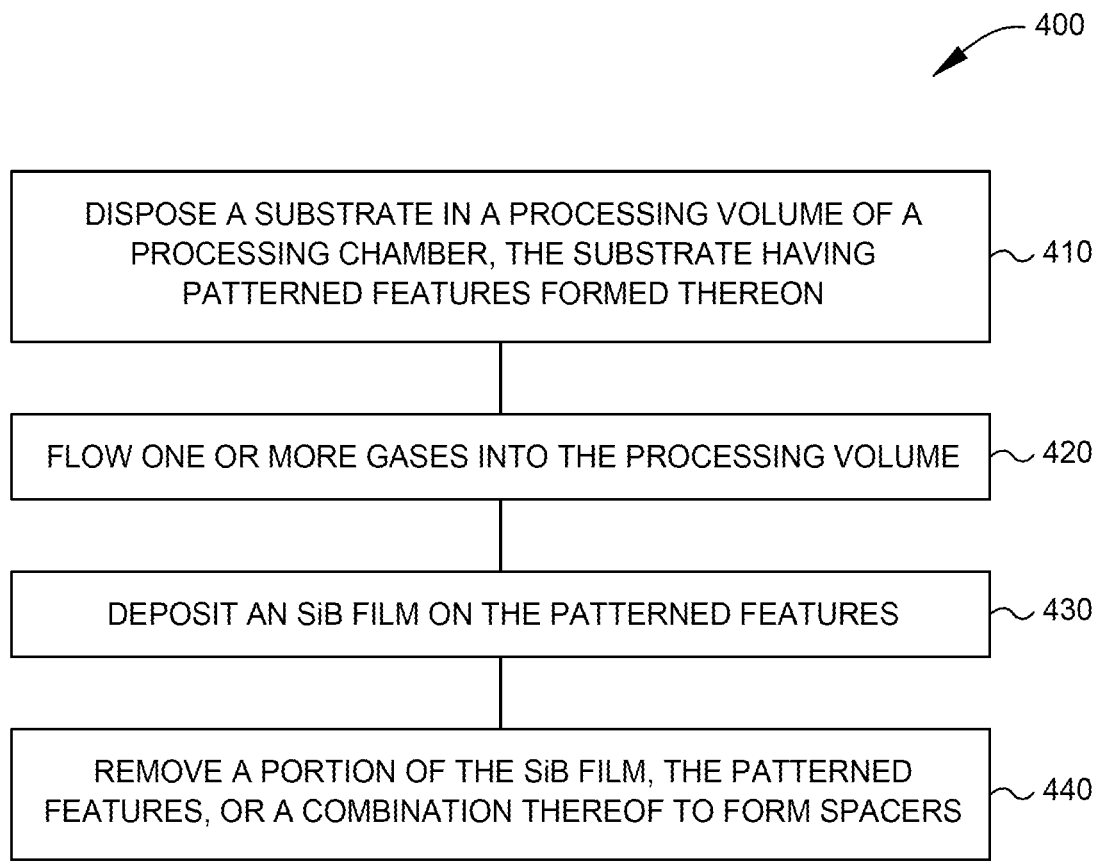
FIG. 4 is a flowchart showing selected operations of an example process for forming spacers according to at least one embodiment of the present disclosure.

FIG. 4 is a flowchart showing selected operations of an example deposition process 400 according to at least one embodiment of the present disclosure. The process enables, e.g., formation of an SiB film such as SiB film 306. The SiB film can be a conformal film used for spacer applications. The SiB film can be a monolayer film or multilayer film. The SiB film can be amorphous. The SiB films described herein have etch-selectivity benefits over conventional SiN films (such as SiN films made by atomic layer deposition), or other etchable films involved in patterning schemes. For example, as compared to SiN films, the SiB films formed by processes described herein can have a more uniform post-etch spacer profile with a square top profile. Moreover, the process enables formation of an SiB film (or layer(s)) having improved surface roughness (e.g., LER and/or LWR) relative to conventional methods.

Process 400 includes disposing a substrate in a processing volume of a substrate processing chamber (e.g., a CVD chamber, such as a thermal CVD chamber) at operation 410. The substrate 302 (or underlying layer) can have patterned features. The mandrels 304 may include or consist of various suitable materials such as a carbon-containing material, silicon (e.g., polysilicon), or silicon oxide, among other materials. Mandrels may include carbon and hydrogen, or may be deposited as a spin-on carbon film. The mandrels 304 can be formed by forming a flat layer of mandrel material on the substrate and lithographically (for example, photolithographically) defining then forming the mandrels near the resolution limit of the lithographic process.

In an embodiment, mandrels 304 are a combination of amorphous carbon and hydrogen (hydrogenated amorphous carbon). The hydrogenated amorphous carbon film may be Advanced Patterning Film™ (APF) made by Applied Materials of Santa Clara, Calif. Hydrogenated amorphous carbon may have an atomic composition from about 10 percent hydrogen to about 60 percent hydrogen. Either lower temperature (e.g., about 300° C.) or higher temperature (e.g., about 480° C., about 550° C., about 650° C.) APF films can be used where the temperature refers to the deposition temperature of the film and the films may be succinctly referred to as APF300, APF480, APF550 or APF650.

Process 400 further includes flowing one or more gases into the processing volume within the processing chamber at operation 420. Operation 420 can be performed in the same, or similar manner, as operation 220.

The process 400 further includes depositing, under deposition conditions, a film (or layer(s)) on the patterned features, the film (or layer(s)) comprising silicon and boron at operation 430. The deposited layer(s) can be amorphous. The deposited film (or layer(s)) can be represented by the SiB film 306 of structure 300b, as shown in FIG. 3. The deposition of operation 430 can be performed in the same or similar manner as operation 230. The deposition results in, e.g., a conformal SiB film or spacer.

The film deposited in operation 430 can be subjected to various optional processes. For example, a spacer etching operation can be performed where at least a portion of the SiB film (or layer(s)), the patterned features, or a combination thereof is etched. As an example, and at operation 350, horizontal portions of the SiB film 306 and/or mandrels 304 are removed to form the spacers 308, as illustrated by structure 300c. The spacers 308 contain SiB film. Removal/etching can be accomplished by suitable methods in the same or a different chamber.

The SiB film (or layer(s)) formed by processes described herein, e.g., process 200 or process 400 has improved roughness relative to SiB films made according to conventional methods. For example, the LER can be about 1.5 nm or less, such as about 1.0 nm or less, and/or the LWR can be about 1.5 nm or less, such as about 1.0 nm or less. LER is defined as the 3σ deviation of a line edge from a straight line, and LWR is defined as 3σ deviation corresponding to the variation in width of a feature across the line.

The SiB film (or layer(s)) formed by processes described herein, can have, e.g., etch advantages over SiN, making the SiB formed herein useful for spacer applications. For example, the SiB formed can have a more uniform post-etch spacer profile with a more square top profile than SiN, and can have better etch selectivity against other films involved in various patterning schemes.

New and improved processes for forming SiB films having improved characteristics, such as roughness profiles, are described herein. The SiB films formed by processes described herein have application in patterning schemes, hard mask applications, and multicolor applications, among others. Accordingly, embodiments described herein enable, e.g., improved device performance.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

For the purposes of this present disclosure, and unless otherwise specified, the terms "group," and "substituent" may be used interchangeably. For the purposes of this present disclosure, and unless otherwise specified, the term "alkyl" or "alkyl group" interchangeably refers to a hydrocarbyl consisting of carbon and hydrogen atoms. An alkyl group can be substituted or unsubstituted and can be linear, branched, or cyclic.

For the purposes of this present disclosure, and unless otherwise specified, the terms "alkoxy" refers to an alkyl or aryl group bound to an oxygen atom, such as an alkyl ether or aryl ether group connected to an oxygen atom and can include those where the alkyl/aryl group is a $C_1$-$C_{10}$ hydrocarbyl. The alkyl group may be straight chain, branched, or cyclic. The alkyl group may be saturated or unsaturated.

For the purposes of this present disclosure, and unless otherwise specified, the term "hydrocarbyl" refers to a group consisting of hydrogen and carbon atoms only. A hydrocarbyl can be saturated or unsaturated, linear or branched, cyclic or acyclic, aromatic, or non-aromatic. For the purposes of this present disclosure, and unless otherwise specified, the term "aryl" or "aryl group" refers to an aromatic ring such as phenyl, naphthyl, xylyl, etc. As used herein, the term "aromatic" also refers to pseudoaromatic heterocycles which are heterocyclic substituents that have similar properties and structures (nearly planar) to aromatic heterocyclic ligands, but are not by definition aromatic.

For the purposes of this present disclosure, and unless otherwise specified, a "substituted" group refers to a group in which at least one atom is replaced by a different atom or a group. Thus, a "substituted hydrocarbyl", a "substituted aryl", and a "substituted alkyl" refers to a hydrocarbyl, aryl, or alkyl in which at least one hydrogen atom has been replaced with at least one heteroatom or heteroatom-containing group, such as one or more elements from Group 13-17 of the periodic table of the elements, such as halogen (F, Cl, Br, or I), O, N, Se, Te, P, As, Sb, S, B, Si, Ge, Sn, Pb, and the like, such as C(O)R*, C(O)NR*$_2$, C(O)OR*, NR*$_2$, OR*, PR*$_2$, SR*, SO$_x$ (e.g., where x=2 or 3), BR*$_2$, SiR*$_3$, OSiR*$_3$, and the like or where at least one heteroatom has been inserted within the hydrocarbyl, aryl, or alkyl such as one or more of halogen (Cl, Br, I, F), O, N, S, Se, Te, NR*, PR*, BR*, SiR*$_2$, and the like, where R* is, independently, hydrogen, hydrocarbyl (e.g., $C_1$-$C_{10}$), or two or more R* may join together to form a substituted or unsubstituted completely saturated, partially unsaturated, fully unsaturated, or aromatic cyclic or polycyclic ring structure.

For the purposes of this disclosure, and unless otherwise specified, all numerical values within the detailed description and the claims herein are modified by "about" or "approximately" the indicated value, and consider experimental error and variations that would be expected by a person having ordinary skill in the art. Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

While the foregoing is directed to embodiments of the present disclosure, other and further embodiments of the disclosure can be devised without departing from the basic scope thereof, and the scope thereof is determined by the claims that follow.

What is claimed is:

1. A spacer-defined patterning process, comprising:
    disposing a substrate in a processing volume of a processing chamber, the substrate having patterned features formed thereon;
    pretreating the substrate to form nucleation sites on the patterned features, comprising:
        flowing a silicon-containing species and a boron-containing species into the processing volume to deposit nucleation sites on the patterned features, the nucleation sites comprising a silicon and boron material; and
    directly after pretreating the substrate, depositing a conformal film on the nucleation sites, comprising:
        flowing a first process gas into the processing volume, the first process gas comprising a silicon-containing species, the silicon-containing species having a higher molecular weight than $SiH_4$;
        flowing a second process gas into the processing volume, the second process gas comprising a boron-containing species; and
        depositing, under deposition conditions, the conformal film on the nucleation sites, the conformal film comprising silicon and boron.

2. The process of claim 1, wherein a number of silicon atoms in the silicon-containing species used for the depositing the conformal film on the nucleation sites is from 2 to 6 silicon atoms.

3. The process of claim 1, wherein the silicon-containing species used for the depositing the conformal film on the nucleation sites is:
    a compound having the formula $Si_nH_{2n+2}$, where n is 2 or more;
    a compound having the formula $Si_xX'_yH_{(2x+2-y)}$, where:
        x is 1 or more,
        y is 1 or more, and
        each X' is, independently, a halogen, $C_1$-$C_6$ hydrocarbyl, $C_1$-$C_{20}$ substituted hydrocarbyl, $C_1$-$C_{22}$ aryl, $C_1$-$C_{22}$ substituted aryl, —NR'$_2$, —SR', —OR', —OSiR'$_3$, or —PR'$_2$, or combinations thereof wherein each R' is independently hydrogen, halogen, $C_1$-$C_{10}$ alkyl, or $C_6$-$C_{10}$ aryl; or
    a combination thereof.

4. The process of claim 3, wherein the silicon-containing species used for the depositing the conformal film on the nucleation sites comprises disilane, trisilane, tetrasilane, dichlorosilane, trichlorosilane, tetrachlorosilane, diiodosilane, bis(t-butylamino)silane, tris(dimethylamino)silane, or combinations thereof.

5. The process of claim 1, wherein the silicon-containing species used for the depositing the conformal film on the nucleation sites comprises disilane and the boron-containing species comprises diborane.

6. The process of claim 1, wherein for the depositing the conformal film on the nucleation sites, the first process gas and the second process gas are co-flown into the processing volume.

7. The process of claim 1, wherein during the depositing the conformal film on the nucleation sites, the second process gas is intermittently flown into the processing volume while the first process gas is flown into the processing volume.

8. The process of claim 1, wherein during the depositing the conformal film on the nucleation sites, an additional amount of the second process gas is flown into the processing volume.

9. The process of claim 1, wherein the deposition conditions comprise:
    heating the substrate to a temperature of about 150° C. to about 350° C.;
    maintaining the processing volume at a pressure of about 1 Torr to about 150 Torr; or
    a combination thereof.

10. The process of claim 1, wherein:
the pretreating the substrate to form the nucleation sites comprises forming a plasma from the silicon-containing species and the boron-containing species; and
the depositing the conformal film on the nucleation sites is performed by a thermal chemical vapor deposition.

11. The process of claim 1, wherein the first process gas further comprises a non-reactive gas.

12. The process of claim 11, wherein:
a flow rate of the silicon-containing species during the pretreating is the same as or higher than a flow rate of the silicon-containing species during the depositing; and
a flow rate of the boron-containing species during the pretreating is higher than the flow rate of the boron-containing species during the depositing.

13. The process of claim 12, wherein the silicon-containing species used for the depositing the conformal film on the nucleation sites is:
a compound having the formula $Si_nH_{2n+2}$, where n is 2 to 6;
a compound having the formula $Si_xX'_yH_{(2x+2-y)}$, where:
x is 1 or more,
y is 1 or more, and
each X' is, independently, a halogen, $C_1$-$C_6$ hydrocarbyl, $C_1$-$C_{20}$ substituted hydrocarbyl, $C_1$-$C_{22}$ aryl, $C_1$-$C_{22}$ substituted aryl, or —$NR'_2$, wherein each R' is independently hydrogen, halogen, $C_1$-$C_{10}$ hydrocarbyl, or $C_6$-$C_{10}$ aryl; or
a combination thereof.

14. The process of claim 1, wherein after the depositing the conformal film, the process further comprises:
etching a portion of the conformal film, the patterned features, or a combination thereof, to form a spacer.

15. The process of claim 14, wherein the silicon-containing species used for the depositing the conformal film on the nucleation sites comprises disilane, trisilane, tetrasilane, dichlorosilane, trichlorosilane, tetrachlorosilane, diiodosilane, bis(t-butylamino)silane, tris(dimethylamino)silane, or combinations thereof.

16. The process of claim 14, wherein the deposition conditions comprise:
heating the substrate to a temperature of about 150° C. to about 350° C.;
maintaining the processing volume at a pressure of about 1 Torr to about 150 Torr; or
a combination thereof.

17. A process for controlling film roughness, comprising:
disposing a substrate in a processing volume of a processing chamber, the substrate having patterned features formed thereon;
pretreating the substrate to form nucleation sites on the patterned features, comprising:
flowing a silicon-containing species and a boron-containing species into the processing volume;
forming a plasma from the silicon-containing species and the boron-containing species; and
depositing the nucleation sites comprising a silicon and boron material on the patterned features; and
directly after pretreating the substrate, depositing by thermal chemical vapor deposition a film on the nucleation sites, comprising:
flowing a first process gas comprising a silicon-containing species into the processing volume, the silicon-containing species having a higher molecular weight than $SiH_4$;
flowing a second process gas comprising a boron-containing species into the processing volume; and
depositing, under deposition conditions, the film on the nucleation sites, the film comprising silicon and boron, the film having a line edge roughness of about 1.5 nm or less.

18. A patterning process, comprising:
disposing a substrate in a processing volume of a thermal chemical vapor deposition chamber, the substrate having patterned features formed thereon;
pretreating the substrate to form nucleation sites on the patterned features, comprising:
flowing a silicon-containing species and a boron-containing species into the processing volume;
forming a plasma from the silicon-containing species and a boron-containing species; and
depositing the nucleation sites comprising a silicon and boron material on the patterned features;
directly after pretreating the substrate, depositing by thermal chemical vapor deposition a silicon boron (SiB) film on the nucleation sites, comprising:
flowing a first process gas comprising a silicon-containing species into the processing volume, the silicon-containing species comprising disilane, trisilane, tetrasilane, dichlorosilane, trichlorosilane, tetrachlorosilane, diiodosilane, bis(t-butylamino)silane, tris(dimethylamino)silane, or combinations thereof;
flowing a second process gas comprising a boron-containing species into the processing volume, the boron-containing species comprising diborane ($B_2H_6$), trimethylborane ($B(CH_3)_3$), triethylborane ($B(C_2H_5)_3$), boron trifluoride ($BF_3$), or combinations thereof;
depositing the SiB film on the nucleation sites; and
etching a portion of the deposited SiB film, the patterned features, or a combination thereof.

19. The patterning process of claim 18, wherein:
the silicon-containing species used for the depositing the SiB film on the nucleation sites is disilane; and
the boron-containing species used for the depositing the SiB film on the nucleation sites is diborane.

20. The patterning process of claim 18, wherein during the depositing the SiB film on the nucleation sites:
the substrate is heated at a temperature of about 200° C. to about 250° C. or less during deposition; and
the processing volume is maintained at a pressure of about 10 Torr to about 130 Torr.

* * * * *